(12) United States Patent
Ando et al.

(10) Patent No.: US 9,831,084 B2
(45) Date of Patent: Nov. 28, 2017

(54) HYDROXYL GROUP TERMINATION FOR NUCLEATION OF A DIELECTRIC METALLIC OXIDE

(71) Applicant: International Business Machines Corporation, Armonk, NY (US)

(72) Inventors: Takashi Ando, Tuckahoe, NY (US); Michael P. Chudzik, Danbury, CT (US); Min Dai, Mahwah, NJ (US); Martin M. Frank, Dobbs Ferry, NY (US); David F. Hilscher, Poughkeepsie, NY (US); Rishikesh Krishnan, Poughkeepsie, NY (US); Barry P. Linder, Hastings-on-Hudson, NY (US); Claude Ortolland, Peekskill, NY (US); Joseph F. Shepard, Jr., Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 110 days.

(21) Appl. No.: 14/874,386

(22) Filed: Oct. 3, 2015

(65) Prior Publication Data

US 2016/0027640 A1    Jan. 28, 2016

Related U.S. Application Data

(62) Division of application No. 13/863,580, filed on Apr. 16, 2013, now Pat. No. 9,373,501.

(51) Int. Cl.
*H01L 21/311* (2006.01)
*H01L 21/8238* (2006.01)
(Continued)

(52) U.S. Cl.
CPC .... *H01L 21/02301* (2013.01); *C23C 16/0227* (2013.01); *C23C 16/405* (2013.01);
(Continued)

(58) Field of Classification Search
CPC ......... H01L 27/0922; H01L 21/823807; H01L 21/823857; H01L 21/02181;
(Continued)

(56) References Cited

U.S. PATENT DOCUMENTS

| 5,960,289 A | * | 9/1999 | Tsui | ................. | H01L 21/823462 257/E21.625 |
| 6,362,059 B2 | * | 3/2002 | Fukasaku | ........ | H01L 21/823412 257/E21.618 |

(Continued)

OTHER PUBLICATIONS

Liao, C.-I., et al., "Effective SurfaceTreatments for Selective Epitaxial SiGe Growth in Locally Strained pMOSFETs", SiGe Technology and Device Meeting, 2006, ISTDM 2006, Third International, May 2006.

*Primary Examiner* — Mary Wilczewski
(74) *Attorney, Agent, or Firm* — Scully, Scott, Murphy & Presser, P.C.; Steven J. Meyers

(57) ABSTRACT

A surface of a semiconductor-containing dielectric material/oxynitride/nitride is treated with a basic solution in order to provide hydroxyl group termination of the surface. A dielectric metal oxide is subsequently deposited by atomic layer deposition. The hydroxyl group termination provides a uniform surface condition that facilitates nucleation and deposition of the dielectric metal oxide, and reduces interfacial defects between the oxide and the dielectric metal oxide. Further, treatment with the basic solution removes more oxide from a surface of a silicon germanium alloy with a greater atomic concentration of germanium, thereby reducing a differential in the total thickness of the combination of (Continued)

the oxide and the dielectric metal oxide across surfaces with different germanium concentrations.

15 Claims, 8 Drawing Sheets

(51) Int. Cl.
| | |
|---|---|
| H01L 29/51 | (2006.01) |
| H01L 21/02 | (2006.01) |
| H01L 21/28 | (2006.01) |
| C23C 16/02 | (2006.01) |
| C23C 16/455 | (2006.01) |
| H01L 21/762 | (2006.01) |
| H01L 29/16 | (2006.01) |
| H01L 29/161 | (2006.01) |
| C23C 16/40 | (2006.01) |

(52) U.S. Cl.
CPC .... *C23C 16/45525* (2013.01); *H01L 21/0214* (2013.01); *H01L 21/0228* (2013.01); *H01L 21/02164* (2013.01); *H01L 21/02178* (2013.01); *H01L 21/02181* (2013.01); *H01L 21/02186* (2013.01); *H01L 21/02189* (2013.01); *H01L 21/02192* (2013.01); *H01L 21/02236* (2013.01); *H01L 21/02238* (2013.01); *H01L 21/02247* (2013.01); *H01L 21/02249* (2013.01); *H01L 21/02307* (2013.01); *H01L 21/02312* (2013.01); *H01L 21/28194* (2013.01); *H01L 21/762* (2013.01); *H01L 29/16* (2013.01); *H01L 29/161* (2013.01); *H01L 29/513* (2013.01); *H01L 29/517* (2013.01); *H01L 29/518* (2013.01); *C23C 16/403* (2013.01); *C23C 16/407* (2013.01)

(58) Field of Classification Search
CPC ......... H01L 21/02186; H01L 21/02189; H01L 21/02192; H01L 21/02178; H01L 21/02172; H01L 21/02183; H01L 21/0228; H01L 21/02307; H01L 21/02312; H01L 21/28194
See application file for complete search history.

(56) References Cited

U.S. PATENT DOCUMENTS

| | | | |
|---|---|---|---|
| 6,492,283 B2 | 12/2002 | Raaijmakers et al. | |
| 6,528,858 B1* | 3/2003 | Yu .................... | H01L 21/28167 257/493 |
| 6,713,353 B1* | 3/2004 | Kanda ............. | H01L 21/823878 257/E21.639 |
| 6,727,130 B2* | 4/2004 | Kim ................ | H01L 21/823857 257/E21.637 |
| 6,730,566 B2* | 5/2004 | Niimi ............. | H01L 21/823462 257/E21.625 |
| 6,759,302 B1* | 7/2004 | Chen et al ........ | H01L 21/28202 257/410 |
| 6,787,421 B2* | 9/2004 | Gilmer ............ | H01L 21/823462 257/E21.01 |
| 7,270,130 B2 | 9/2007 | Ramachandran et al. | |
| 7,436,036 B2* | 10/2008 | Lee .................. | H01L 21/28194 257/369 |
| 7,445,981 B1* | 11/2008 | Karve ............. | H01L 21/823807 257/369 |
| 7,511,217 B1 | 3/2009 | Roscheisen et al. | |
| 7,691,701 B1 | 4/2010 | Belyansky et al. | |
| 7,709,331 B2* | 5/2010 | Karve ............. | H01L 21/823412 257/E21.625 |
| 7,776,701 B2 | 8/2010 | Callegari et al. | |
| 7,943,458 B2 | 5/2011 | Jagannathan et al. | |
| RE43,673 E | 9/2012 | Hou et al. | |
| 8,268,683 B2 | 9/2012 | Yao et al. | |
| 8,460,996 B2* | 6/2013 | Karve ............. | H01L 21/823807 257/299 |
| 8,735,244 B2 | 5/2014 | Chudzik et al. | |
| 8,941,184 B2* | 1/2015 | Ando ............. | H01L 21/823807 257/369 |
| 9,263,344 B2* | 2/2016 | Ando ............. | H01L 21/823842 |
| 9,373,501 B2* | 6/2016 | Ando ............. | H01L 21/02181 |
| 9,455,203 B2* | 9/2016 | Ando ............. | H01L 21/823842 |
| 2002/0164858 A1* | 11/2002 | Sayama ......... | H01L 21/823807 438/289 |
| 2005/0145944 A1* | 7/2005 | Murthy .......... | H01L 21/823807 257/351 |
| 2005/0277296 A1 | 12/2005 | Adetutu et al. | |
| 2006/0091469 A1* | 5/2006 | Ho ................... | H01L 21/31111 257/368 |
| 2006/0091769 A1* | 5/2006 | Dubon ............. | A47B 88/49 312/333 |
| 2006/0170047 A1* | 8/2006 | Ishimaru .......... | H01L 21/28052 257/347 |
| 2006/0255315 A1 | 11/2006 | Yellowaga et al. | |
| 2006/0267116 A1* | 11/2006 | Shimamoto ....... | H01L 21/28202 257/411 |
| 2007/0001241 A1* | 1/2007 | Lim ................ | H01L 21/823857 257/410 |
| 2008/0166470 A1 | 7/2008 | Schwartz et al. | |
| 2009/0004792 A1* | 1/2009 | Karve ............. | H01L 21/823807 438/222 |
| 2009/0315099 A1* | 12/2009 | Park ................ | H01L 27/11526 257/324 |
| 2010/0001364 A1* | 1/2010 | Hu .................. | H01L 21/76229 257/500 |
| 2010/0041221 A1 | 2/2010 | Arnold et al. | |
| 2010/0167482 A1* | 7/2010 | Mori .............. | H01L 21/823857 438/285 |
| 2012/0202357 A1 | 8/2012 | Sato et al. | |
| 2012/0299113 A1* | 11/2012 | Endo .............. | H01L 21/02181 257/369 |
| 2013/0221412 A1* | 8/2013 | Bian ................ | H01L 27/1207 257/255 |
| 2013/0254019 A1* | 9/2013 | Liu ................ | G06Q 30/02 705/14.46 |
| 2013/0292807 A1 | 11/2013 | Raisanen et al. | |
| 2014/0312423 A1* | 10/2014 | Cheng ............. | H01L 21/823807 257/351 |
| 2015/0031177 A1* | 1/2015 | Riley .............. | H01L 21/823807 438/199 |
| 2015/0031178 A1* | 1/2015 | Riley .............. | H01L 21/823807 438/199 |
| 2015/0069524 A1* | 3/2015 | Hong .............. | H01L 27/1203 257/392 |
| 2015/0147876 A1* | 5/2015 | Ando ............. | H01L 21/823842 438/591 |
| 2016/0126145 A1* | 5/2016 | Ando ............. | H01L 21/823842 438/590 |
| 2016/0148847 A1* | 5/2016 | Lee ................ | H01L 21/823807 438/199 |

* cited by examiner

US 9,831,084 B2

HYDROXYL GROUP TERMINATION FOR NUCLEATION OF A DIELECTRIC METALLIC OXIDE

BACKGROUND

The present disclosure relates to a method of forming a semiconductor structure, and particularly to a method of surface treatment of a semiconductor-containing dielectric material for subsequent deposition of a dielectric metal oxide.

Nucleation of dielectric metal oxides, such as hafnium oxide, deposited by atomic layer deposition (ALD) is known to be affected by the surface conditions. The thickness and quality of dielectric metal oxides formed by ALD varies according to the surface conditions of an interfacial dielectric material, which is a semiconductor-containing dielectric material such as silicon oxide/oxynitride/nitride or a silicon-germanium oxide/oxynitride/nitride. Poor nucleation results in poor quality of dielectric metal oxides.

In addition, the thickness of an interfacial dielectric material increases with the atomic concentration of germanium in a silicon-germanium alloy material on which the interfacial dielectric material is formed by chemical or dielectric conversion. Thus, an interfacial dielectric material formed on a surface of a silicon germanium alloy is thicker than an interfacial dielectric material formed on a silicon surface employing the same processing conditions. When different semiconductor materials are used across different semiconductor device regions, e.g., across p-type field effect transistors and n-type field effect transistors, the total thickness of dielectric material layers including a dielectric metal oxide formed by ALD can be different due to the differences in thickness of the interfacial dielectric material. Such differences are not desirable because some type of devices incorporate an unnecessarily thick dielectric material layer.

BRIEF SUMMARY

A surface of a semiconductor-containing dielectric material is treated with a basic solution in order to provide hydroxyl group termination of the surface. A dielectric metal oxide is subsequently deposited by atomic layer deposition. The hydroxyl group termination provides a uniform surface condition that facilitates nucleation and deposition of the dielectric metal oxide, and reduces interfacial defects between the oxide and the dielectric metal oxide. Further, treatment with the basic solution removes more oxide from a surface of a silicon germanium alloy with a greater atomic concentration of germanium, thereby reducing a differential in the total thickness of the combination of the oxide and the dielectric metal oxide across surfaces with different germanium concentrations.

According to an aspect of the present disclosure, a method of forming a semiconductor structure is provided. A semiconductor-containing dielectric material layer is formed on a semiconductor material portion of a substrate. A hydroxyl group terminated surface of the semiconductor-containing dielectric material layer is formed by treating a top surface of the semiconductor-containing dielectric material with an etchant selected from a basic solution and a basic vapor. A metal oxide layer is deposited directly on the hydroxyl group terminated surface employing atomic layer deposition.

According to another aspect of the present disclosure, a method of forming a semiconductor device is provided. A first device region having a first semiconductor material portion is provided. A second device region having a second semiconductor material portion is provided, which includes a different semiconductor material than the first semiconductor material portion. A semiconductor-containing dielectric material layer is formed on the first semiconductor material portion and the second semiconductor material portion. A metal oxide layer is formed on the semiconductor-containing dielectric material layer. A portion of the metal oxide layer and a portion of the semiconductor-containing dielectric material layer form a gate oxide material in each of the first and second device regions. The difference in thickness of the gate oxide materials over the first device region and the second device region is less than 3 angstroms.

DETAILED DESCRIPTION

Figure 1:
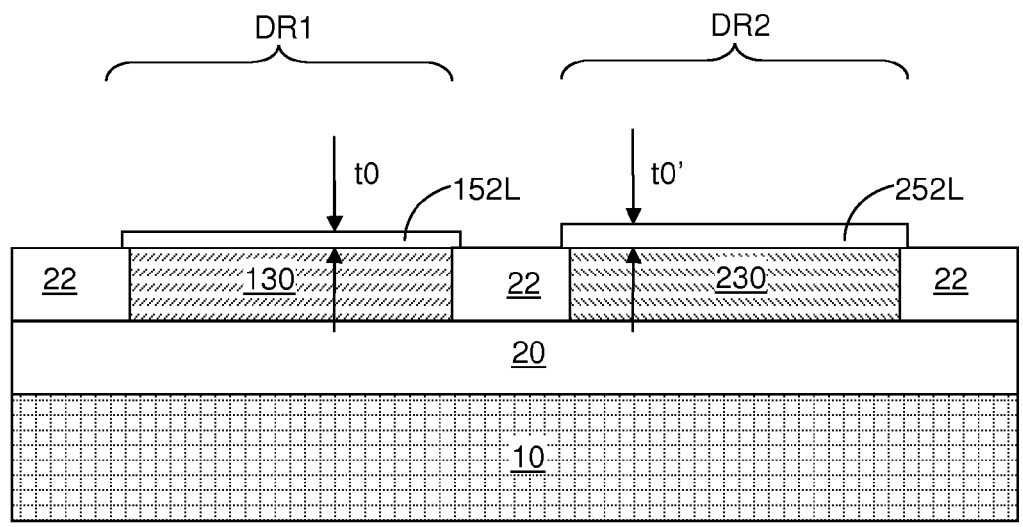
FIG. 1 is a vertical cross-sectional view of an exemplary semiconductor structure after formation of an interfacial dielectric material layer in each of two device regions according to an embodiment of the present disclosure.

As stated above, the present disclosure relates to a method of surface treatment of a semiconductor-containing dielectric material for subsequent deposition of a dielectric metal oxide. Aspects of the present disclosure are now described in detail with accompanying figures. It is noted that like reference numerals refer to like elements across different embodiments. The drawings are not necessarily drawn to scale. Ordinals are used merely to distinguish among similar elements, and different ordinals may be employed across the specification and the claims of the instant application.

Referring to FIG. 1, an exemplary semiconductor structure according to an embodiment of the present disclosure includes a semiconductor substrate, which can be a semiconductor-on-insulator (SOI) substrate or a bulk substrate. The SOI substrate includes a vertical stack, from bottom to top, of a handle substrate 10, a buried insulator layer 20, and a top semiconductor layer. If the semiconductor substrate is a bulk substrate, a handle substrate and a buried insulator layer are not present, and the top semiconductor layer can extend throughout the entirety of the substrate.

The handle substrate 10 can include a semiconductor material, a conductive material, and/or a dielectric material. The handle substrate 10 provides mechanical support to the buried insulator layer 20 and the top semiconductor layer. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer includes a first semiconductor material portion 130 located in a first device region DR1, a second semiconductor material portion 230 located in a second device region DR2, and a shallow trench isolation structure 22 laterally surrounding the first semiconductor material portion 130 and the second semiconductor material portion 230. At least an upper portion of the first semiconductor material portion 130 includes a first semiconductor material. At least an upper portion of the second semiconductor material portion 230 includes a second semiconductor material. In one embodiment, the entirety of the first semiconductor material portion 130 can include the first semiconductor material. In another embodiment, the entirety of the second semiconductor material portion 230 can include the second semiconductor material. In yet another embodiment, the first semiconductor material portion 130 can include a vertical stack, from top to bottom, of the first semiconductor material and another semiconductor material. In still another embodiment, the second semiconductor material portion 230 can include a vertical stack, from top to bottom, of the second semiconductor material and another semiconductor material.

Each of the first semiconductor material and the second semiconductor material can independently be an elemental semiconductor material or a compound semiconductor material. For example, each of the first semiconductor material and the second semiconductor material can independently be silicon, germanium, a silicon-germanium alloy, or a silicon-carbon alloy. Each of the first semiconductor material and the second semiconductor material may, or may not, be doped with p-type dopants and/or n-type dopants. Each of the first semiconductor material and the second semiconductor material can be a single crystalline semiconductor material, a polycrystalline semiconductor material, or an amorphous semiconductor material. In one embodiment, the first semiconductor material can be silicon and the second semiconductor material can be a silicon-germanium alloy. In one embodiment, the first semiconductor material can be single crystalline silicon, and the second semiconductor material can be a single crystalline silicon-germanium alloy. The thickness of the top semiconductor layer can be from 10 nm to 500 nm, although lesser and greater thicknesses can also be employed.

A semiconductor-containing dielectric material layer can be formed on each semiconductor material portion in the top semiconductor layer of the SOI substrate. Specifically, a first semiconductor-containing dielectric material layer 152L can be formed on the first semiconductor material portion 130 by conversion of a surface portion of the first semiconductor material portion 130 by thermal oxidation and/or plasma oxidation, and a second semiconductor-containing dielectric material layer 252L can be formed on the second semiconductor portion 230 by conversion of a surface portion of the second semiconductor material portion 130 by thermal oxidation and/or plasma oxidation. As used herein, "thermal oxidation" refers to a process that forms a dielectric oxygen-containing compound of a semiconductor material by thermal diffusion of oxygen. The dielectric oxygen-containing compound can be an oxide or an oxynitride.

As used herein, "thermal nitridation" refers to a process that forms a dielectric nitrogen-containing compound of a semiconductor material by thermal diffusion of oxygen. The dielectric nitrogen-containing compound can be a nitride or an oxynitride. As used herein, "thermal oxynitridation" refers to a process that forms a dielectric compound of a semiconductor material that contains oxygen and nitrogen by thermal diffusion of oxygen and nitrogen, i.e., a semiconductor oxynitride. As used herein, "plasma oxidation" refers to a process that forms a dielectric oxygen-containing compound of a semiconductor material by plasma treatment with an oxygen-containing plasma. As used herein, "plasma nitridation" refers to a process that forms a dielectric nitrogen-containing compound of a semiconductor material by plasma diffusion of oxygen. The dielectric nitrogen-containing compound can be a nitride or an oxynitride. As used herein, "plasma oxynitridation" refers to a process that forms a dielectric compound of a semiconductor material that contains oxygen and nitrogen by plasma diffusion of oxygen and nitrogen, i.e., a semiconductor oxynitride. As used herein, a "dielectric conversion process" or a "dielectric conversion" refers to any of thermal oxidation processes, thermal nitridation processes, thermal oxynitridation processes, plasma oxidation processes, plasma nitridation processes, and plasma oxynitridation processes.

The same dielectric conversion process, which can be a thermal oxidation process, a plasma oxidation process, a thermal nitridation process, a plasma nitridation process, a thermal oxynitridation process, a plasma oxynitridation process, or a combination of at least two of the above, can be employed to simultaneously form the first semiconductor-containing dielectric material layer 152L and the second semiconductor-containing dielectric material layer 252L.

The thermal oxidation process is performed at an elevated temperature in an oxidizing ambient. The elevated temperature can be in a range from 600° C. to 1,000° C., although lower and higher temperatures may also be employed. The thermal oxidation process may be a "wet" oxidation process employing $H_2O$ as an oxidizing gas, or may be a "dry" oxidation process employing $O_2$ as an oxidation process.

A thermal nitridation process is performed at an elevated temperature in a nitridating ambient. The elevated temperature can be in a range from 600° C. to 1,000° C., although lower and higher temperatures may also be employed. The thermal nitridation process may employ $NH_3$ and/or $N_2$.

A thermal oxynitridation process may employ a gas including nitrogen and oxygen such as NO, $N_2O$, and/or $NO_2$ so that nitrogen atoms and oxygen atoms may be incorporated into the thermal oxyoxide material subsequently formed. Alternately, a thermal oxynitridation process can employ a mixture of an oxygen-containing gas and a nitrogen-containing gas.

The various thermal oxidation/nitridation/oxynitridation processes may be performed in a furnace, or may be performed in a single-wafer processing tool employing a rapid thermal oxidation process as known in the art.

The plasma oxidation process can be any plasma oxidation process known in the art. The plasma nitridation process can be any plasma nitridation process known in the art. The plasma oxynitridation process can be any plasma oxynitridation process known in the art. The various dielectric conversion processes employing plasma may be performed in a wide temperature range, for example, from room temperature to 600° C.

The first semiconductor-containing dielectric material layer 152L includes a dielectric oxide or a dielectric oxynitride of the first semiconductor material, and the second semiconductor-containing dielectric material layer 252L includes a dielectric oxide or a dielectric oxynitride of the second semiconductor material. The first semiconductor material and the second semiconductor material may be the same (i.e., have the same composition), or may be different (i.e., have different compositions).

In one embodiment, the first semiconductor material and the second semiconductor material can be selected such that dielectric conversion of the second semiconductor material proceeds at a greater rate than dielectric conversion of the first semiconductor material. For example, the first semiconductor material can be single crystalline silicon, and the second semiconductor material can be a single crystalline silicon-germanium alloy. The atomic concentration of germanium in the silicon-germanium alloy can be in a range from 0.1% to 80%, although lesser and greater atomic concentrations may also be employed. In another example, the first semiconductor material a first single crystalline silicon-germanium alloy, and the second semiconductor material can be a second single crystalline silicon-germanium alloys having a greater atomic concentration of germanium than the first semiconductor material. In one embodiment, the first semiconductor material portion 130 can be a single crystalline silicon portion and the first semiconductor-containing dielectric material layer 152L can be a silicon oxide layer, and the second semiconductor material portion 230 can be a single crystalline silicon-germanium alloy portion and the second semiconductor-containing dielectric material layer 252L can be a silicon-germanium oxide layer.

The thickness of the first semiconductor-containing dielectric material layer 152L after the dielectric conversion process is herein referred to an initial first oxide thickness t0, and the thickness of the second semiconductor-containing dielectric material layer 252L after the dielectric conversion process is herein referred to as an initial second oxide thickness t0'. The initial first oxide thickness t0 and the initial second oxide thickness t0' can be in a range from 0.5 nm to 1.5 nm, although lesser and greater thicknesses can also be employed. The first semiconductor-containing dielectric material layer 152L and the second semiconductor-containing dielectric material layer 252L can function as an interfacial dielectric material layer that prevents interaction between a semiconductor material and a dielectric metal oxide material to be subsequently deposited.

Figure 2:
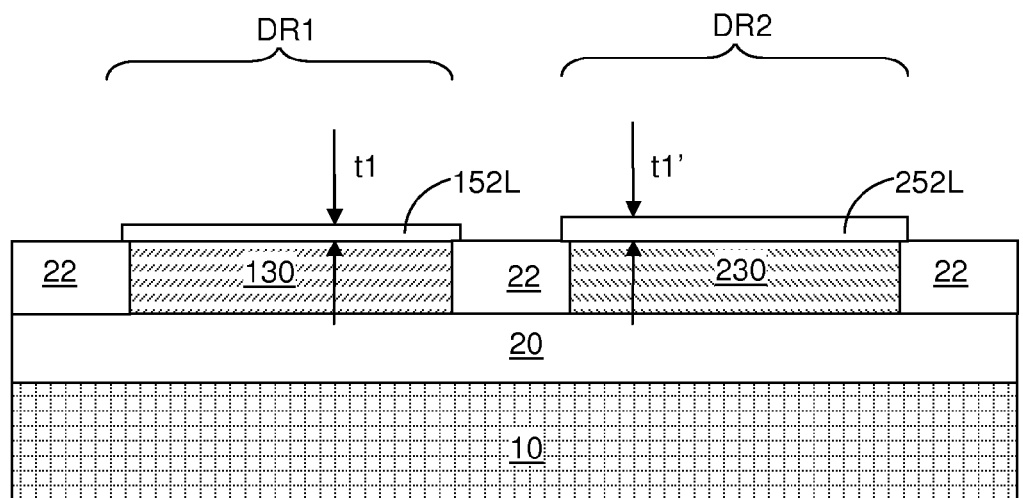
FIG. 2 is a vertical cross-sectional view of the exemplary semiconductor after a surface treatment that forms hydroxyl group on the surface according to an embodiment of the present disclosure.

Referring to FIG. 2, a surface treatment is performed on the top surfaces of the first semiconductor-containing dielectric material layer 152L and the second semiconductor-containing dielectric material layer 252L employing a chemistry that forms hydroxyl group on the top surfaces of the first semiconductor-containing dielectric material layer 152L and the second semiconductor-containing dielectric material layer 252L. A first hydroxyl group terminated surface of the first semiconductor-containing dielectric material layer 152L is formed in the first device region DR1, and a second hydroxyl group terminated surface of the second semiconductor-containing dielectric material layer 252L is formed in the second device region DR2.

Specifically, the top surface of the first semiconductor-containing dielectric material layer 152L and the top surface of the second semiconductor-containing dielectric material layer 252L are simultaneously treated with an etchant selected from a basic solution and a basic vapor. As used herein, a "basic solution" is a water-based solution including more hydroxyl ions (i.e., OH$^-$) than hydrogen ions (i.e., H$^+$). As used herein, a "basic vapor" is a water-based vapor including more hydroxyl ions than hydrogen ions. The etchant simultaneously removes a surface portion of the first semiconductor-containing dielectric material layer 152L and a surface portion of the second semiconductor-containing dielectric material layer 252L.

In one embodiment, the etchant can include an ammonium hydroxide solution or an ammonium hydroxide vapor. In one embodiment, the etchant can include ammonium hydroxide ($NH_4OH$) and hydrogen peroxide ($H_2O_2$). The etchant can further include deionized water. In one embodiment, the volume ratio among ammonium hydroxide, hydrogen peroxide, and deionized water can be 1:x:y. The number x can be in a range from 0.5 to 2, and the number y is in a range from 3 to 20. In one embodiment, the volume ratio among ammonium hydroxide, hydrogen peroxide, and deionized water can be 1:1:5, which is the composition of an SC1 solution.

In another embodiment, the etchant can include a potassium hydroxide solution or a potassium hydroxide vapor. Optionally, hydrogen peroxide can be included in the etchant. The etchant may further include deionized water, either as included in a solution or in vapor particles.

In yet another embodiment, the etchant can include a sodium hydroxide solution or a sodium hydroxide vapor. Optionally, hydrogen peroxide can be included in the etchant. The etchant may further include deionized water, either as included in a solution or in vapor particles.

The thickness of the first semiconductor-containing dielectric material layer 152L after the surface treatment is herein referred to as a post-etch first oxide thickness t1, and the thickness of the second semiconductor-containing dielectric material layer 252L after the surface treatment is herein referred to as a post-etch second oxide thickness t1'. The thickness of the removed surface portion of the first semiconductor-containing dielectric material layer 152L is equal to the difference between the post-etch first oxide thickness t1 and the initial first oxide thickness t0, i.e., t1−t0, and can be in a range from 0.05 nm to 0.5 nm. In one embodiment, the thickness of the removed surface portion of the first semiconductor-containing dielectric material layer 152L can be in a range from 0.1 nm to 0.3 nm. The thickness of the removed surface portion of the second semiconductor-containing dielectric material layer 252L is equal to the difference between the post-etch second oxide thickness t1' and the initial second oxide thickness t0', i.e., t1'−t0', and can be in a range from 0.05 nm to 0.5 nm. In one embodiment, the thickness of the removed surface portion of the second semiconductor-containing dielectric material layer 252L can be in a range from 0.1 nm to 0.3 nm. The thickness of the removed surface portion of the first semiconductor-containing dielectric material layer 152L and the thickness of the removed surface portion of the second semiconductor-containing dielectric material layer 252L may be dependent on the compositions of the first semiconductor-containing dielectric material layer 152L and the second semiconductor-containing dielectric material layer 252L, respectively. In other words, the decrease in the thickness of the first semiconductor-containing dielectric material layer 152L due to the surface treatment with the etchant and the decrease in the thickness of the second semiconductor-containing dielectric material layer 252L defined by t1−t0 may be dependent on the compositions of the first semiconductor-containing dielectric material layer 152L and the second semiconductor-containing dielectric material layer 252L defined by t1'−t0', respectively.

In one embodiment, the thickness of the removed surface portion of the second semiconductor-containing dielectric material layer 252L can be greater than the thickness of the removed surface portion of the first semiconductor-containing dielectric material layer 152L. If the initial second oxide thickness t0' is greater than the initial first oxide thickness t0, the surface treatment decreases a thickness differential between the second semiconductor-containing dielectric material layer 252L and the first semiconductor-containing dielectric material layer 152L upon formation of the hydroxyl group terminated surface of the first semiconductor-containing dielectric material layer 152L and the second semiconductor-containing dielectric material layer 252L. In other words, if t0' is greater than t0, t1'−t0' can be greater than t1−t0. In one embodiment, the atomic concentration of germanium in the second semiconductor-containing dielectric material layer 252L is greater than the atomic concentration of germanium in the first semiconductor-containing dielectric material layer 151 (which can be zero), and the thickness of the removed surface portion of the second semiconductor-containing dielectric material layer 252L (i.e., t1'−t0') is greater than the thickness of the removed surface portion of the first semiconductor-containing dielectric material layer 152L (i.e., t1−t0).

The surface treatment can be a self-limiting etch process in which the thickness of the removed surface portion of the first semiconductor-containing dielectric material layer 152L and the thickness of the removed surface portion of the second semiconductor-containing dielectric material layer 252L asymptotically approaches a limiting value as a function of duration of the surface treatment. For example, etchants based on ammonium hydroxide, potassium hydroxide, and sodium hydroxide can provide such a self-limiting etch property. The thickness of the removed surface portion of the first semiconductor-containing dielectric material layer 152L and the thickness of the removed surface portion of the second semiconductor-containing dielectric material layer 252L depend on the temperature of the etchant, either as a solution or as a vapor. Correspondingly, the temperature and the composition of the etchant can be controlled as parameters to determine the amount of removal of the semiconductor-containing dielectric material layers (152L, 252L).

Figure 3:
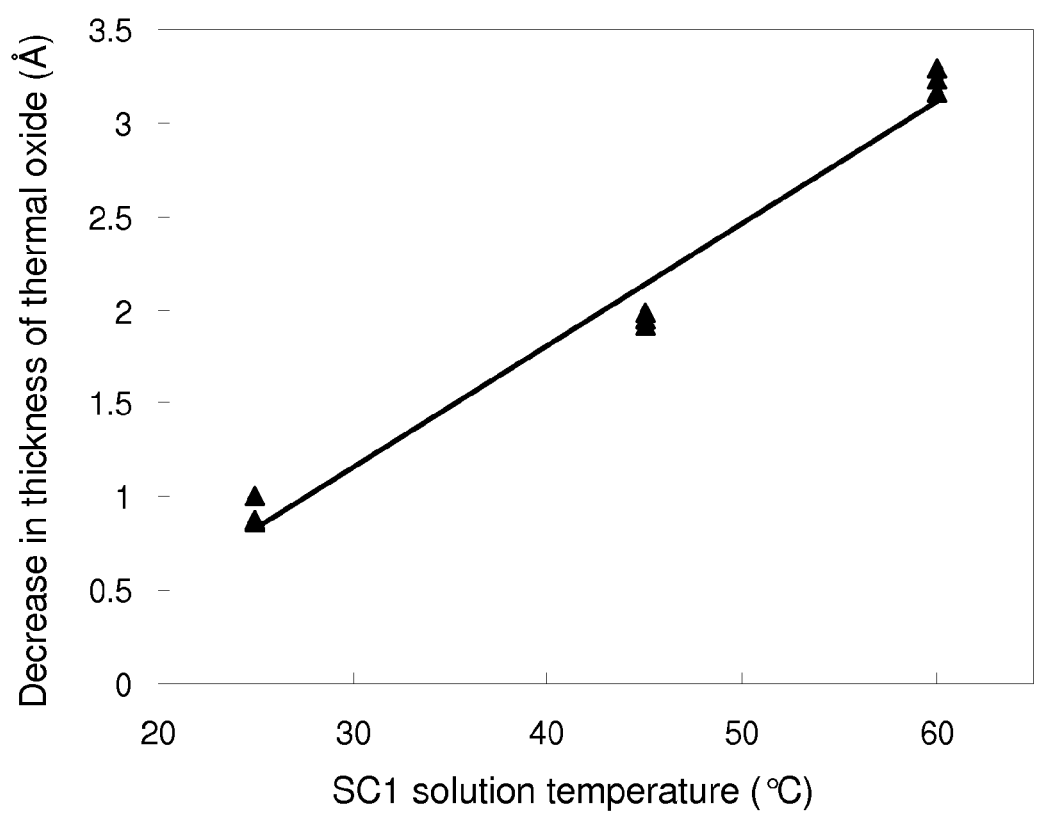
FIG. 3 is a graph illustrating the dependence of decrease in thickness of a silicon oxide as a function of the temperature of the SC1 solution according to an embodiment of the present disclosure.

FIG. 3 illustrates the dependence of decrease in thickness of a thermal silicon oxide as a function of the temperature of the SC1 solution. The thermal silicon oxide employed for this test was formed by rapid thermal oxidation of silicon at a temperature of 900° C. in an oxygen ambient and had an initial oxide thickness of 0.95 nm prior to surface treatment with the SC1 solution, which is a mixture of ammonium hydroxide, hydrogen peroxide, and deionized water at a volume ratio of 1:1:5. The thickness of the removed surface portion of the thermal silicon oxide layer can be in a range from 0.05 nm to 0.5 nm depending on the temperature of the SC1 solution.

It is noted that the SC1 solution tends to etch an oxide of a silicon germanium alloy at a greater etch rate than silicon oxide. The difference in the etch rate may be modified (while oxides of silicon germanium alloys are always etched faster than silicon oxide) by changing the composition (i.e., the ratio of the various components of the SC1 solution) and/or temperature of the SC1 solution.

Figure 4:
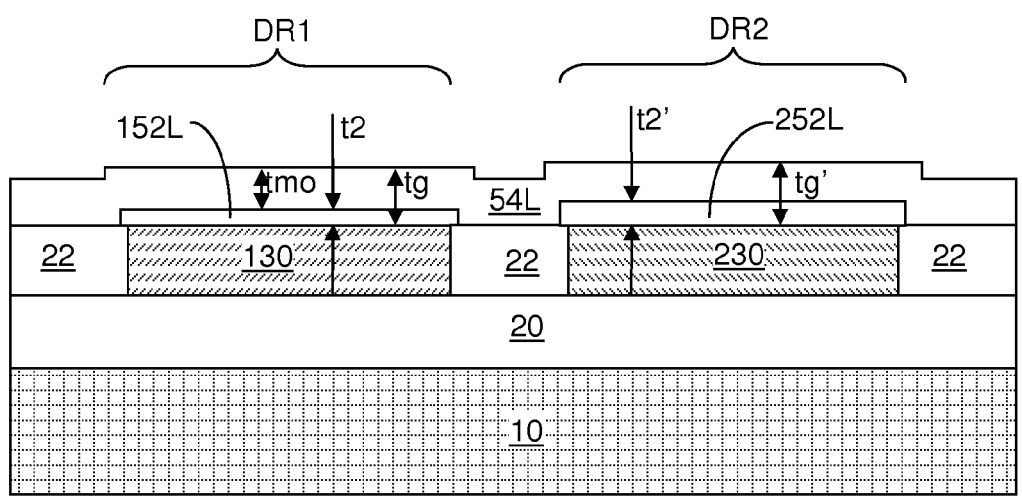
FIG. 4 is a vertical cross-sectional view of the exemplary semiconductor after deposition of a metal oxide layer by atomic layer deposition according to an embodiment of the present disclosure.

Referring to FIG. 4, the SOI substrate with the semiconductor-containing dielectric material layers (152L, 252L) thereupon is loaded into a vacuum environment of a process tool for the atomic layer deposition. In one embodiment, the SOI substrate with the semiconductor-containing dielectric material layers (152L, 252L) thereupon can be loaded in the vacuum environment while at least 90% of the top surface has hydroxyl group termination, i.e., at least 90% of the topmost semiconductor atoms in the semiconductor-containing dielectric material layers (152L, 252L) have an hydroxyl group attached thereto. In another embodiment, the SOI substrate with the semiconductor-containing dielectric material layers (152L, 252L) thereupon can be loaded in the vacuum environment while at least 99% of the top surface has hydroxyl group termination. In yet another embodiment, the SOI substrate with the semiconductor-containing dielectric material layers (152L, 252L) thereupon can be loaded in the vacuum environment while at least 99.9% of the top surface has hydroxyl group termination.

A metal oxide layer 54L is deposited directly on the hydroxyl group terminated surfaces of the semiconductor-containing dielectric material layers (152L, 252L) by an atomic layer deposition (ALD) process in the process tool. In the ALD process, a metal precursor gas and an oxidizing gas (such as oxygen) alternately fills a process chamber in which the SOI substrate is loaded with evacuation of the process chamber between each step in which the metal precursor gas or the oxidizing gas fills the process chamber. A sequential combination of a first evacuation step, a fill step employing the metal precursor gas, a second evacuation step, and a fill step employing the oxidizing gas is referred to as a deposition cycle. Each deposition cycle deposits a monolayer of a dielectric metal oxide material. Thus, the metal oxide layer 54L includes a dielectric metal oxide, i.e., is a dielectric metal oxide layer. In one embodiment, the dielectric metal oxide can consist of an elemental metal and oxygen. In another embodiment, the dielectric metal oxide can be any dielectric metal oxide material that can be deposited by ALD as known in the art.

In one embodiment, the metal oxide layer 54L can include an oxide of a transition metal or an oxide of a Lanthanide element. In one embodiment, the metal oxide layer 54L can include a material selected from $HfO_2$, $ZrO_2$, $La_2O_3$, $Al_2O_3$, $TiO_2$, and $Y_2O_3$. In one embodiment, the dielectric metal oxide layer 54L can be an $HfO_2$ layer. The metal oxide layer 54L can have the same composition and the same thickness over the first semiconductor-containing dielectric material layer 152L and over the second semiconductor-containing dielectric material layer 252L.

The metal oxide layer 54L has a dielectric constant greater than 8.0. The thickness of the metal oxide layer 54L, as measured over the first semiconductor-containing dielectric material layer 152L or over the second semiconductor-containing dielectric material layer 252L, is herein referred to as a metal oxide thickness tmo. The metal oxide thickness tmo depends on the number of deposition cycles in the ALD process.

The thickness of the first semiconductor-containing dielectric material layer 152L after the ALD process is herein referred to as a post-deposition first oxide thickness t2, and the thickness of the second semiconductor-containing dielectric material layer 252L after the ALD process is herein referred to as a post-deposition second oxide thickness t2'. The post-deposition first oxide thickness t2 can be greater than the post-etch first oxide thickness t1, and the post-deposition second oxide thickness t2' can be greater than post-etch second oxide thickness t1'. The total thickness of the stack of the first semiconductor-containing dielectric material layer 152L and the metal oxide layer 54L is herein referred to as a first gate dielectric thickness tg, and the total thickness of the stack of the second semiconductor-containing dielectric material layer 252L and the metal oxide layer 54L is herein referred to as a second gate dielectric thickness tg'.

A portion of the metal oxide layer and a portion of the semiconductor-containing dielectric material layer form a gate oxide material in each of the first and second device regions. The difference in thickness of the gate oxide materials over the first device region and the second device region, i.e., |tg'−tg|, is less than 3 angstroms.

Figure 5:
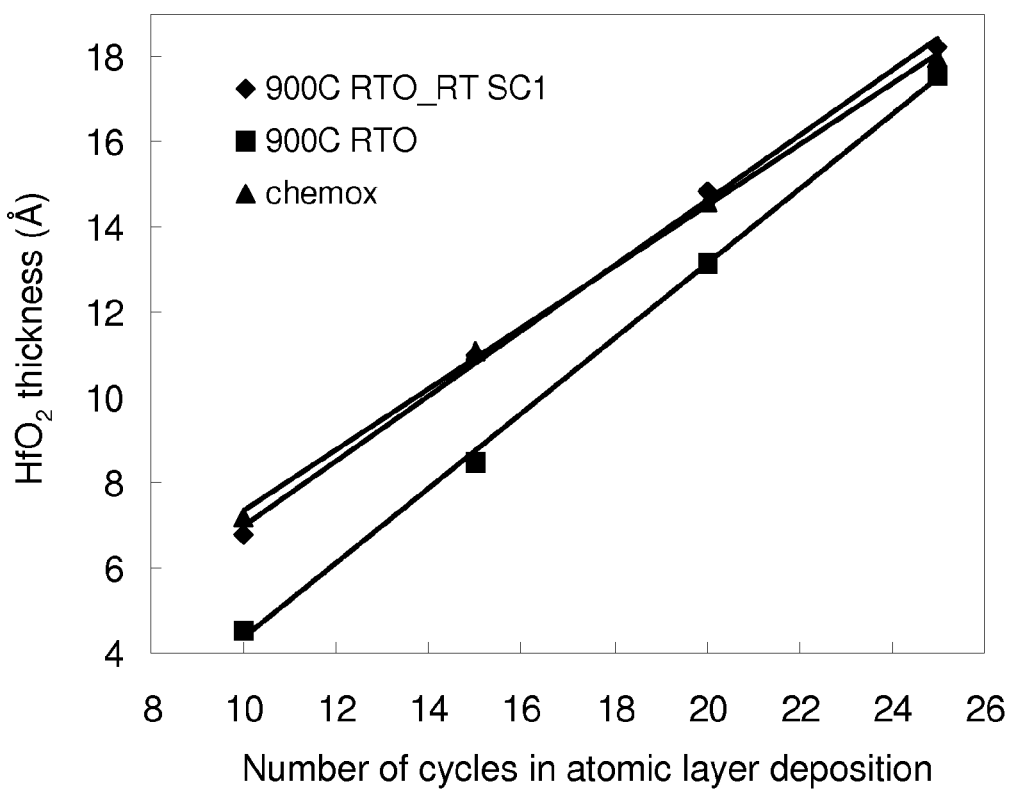
FIG. 5 is a graph illustrating the dependence of the thickness of hafnium oxide on the number of cycles in an atomic layer deposition process for different process sequences according to an embodiment of the present disclosure.

In general, the thickness of a metal oxide layer deposited by an ALD process depends not only on the on the number of deposition cycles in the ALD process, but also on the condition of the surface on which the metal oxide layer nucleates. Referring to FIG. 5, the dependence of the thickness of a hafnium oxide layer deposited by an ALD process is shown as a function of the number of deposition cycles in the ALD process and the type of surface on which the hafnium oxide layer is deposited.

The process sequence labeled "900C RTO_RT SC1" is an exemplary process sequence according to an embodiment of the present disclosure, which is a combination of process conditions including thermal oxidation of a single crystalline silicon surface at 900° C. to form a 0.95 nm thick thermal silicon oxide layer, surface treatment with an SC1 solution at 25° C., and an ALD process for deposition of hafnium oxide on an hydroxyl group terminated surface of the thermal silicon oxide layer. The process sequence labeled "900C RTO" is a first comparative exemplary process sequence, which is a combination of process conditions including thermal oxidation of a single crystalline silicon surface at 900° C. to form a 0.95 nm thick thermal silicon oxide layer, and an ALD process for deposition of hafnium oxide without any surface treatment. The process sequence labeled "chemox" is a second comparative exemplary process sequence, which is a combination of process conditions including growth of chemical oxide on a bare single crystalline surface by an "RCA clean," and an ALD process for deposition of hafnium oxide without any surface treatment.

The RCA clean refers to a sequence of wet etches including a first etch employing an SC1 solution, a rinse in deionized water, a second etch employing a dilute hydrofluoric acid, and a third etch employing an SC2 solution. The SC1 solution removes organic contaminants, and employs a 1:1:5 solution of ammonium hydroxide, hydrogen peroxide, and deionized water at 80° C. for 10 minutes. Treatment with the SC1 solution on the surface of a bare silicon results in the formation of a thin silicon dioxide layer of about 1 nm on the silicon surface, along with a certain degree of metallic contamination. The dilute hydrofluoric acid can be a 1:50 solution of HF and deionized water at 25° C. Immersion in the dilute hydrofluoric acid removes the thin oxide layer and some fraction of ionic contaminants. The SC2 solution is a 1:1:6 solution of hydrochloric acid, hydrogen peroxide, and deionized water at 80° C. The treatment with the SC2 solution effectively removes the remaining traces of metallic (ionic) contaminants. After the RCA clean, a chemical oxide is present on the surface of the single crystalline silicon material.

The dependence of thickness on the number of deposition cycles of the hafnium oxide ALD process for the "900C RTO_RT SC1" process sequence is similar to the dependence of thickness on the number of deposition cycles of the hafnium oxide ALD process for the "chemox" process sequence, and is superior to the dependence of thickness on the number of deposition cycles of the hafnium oxide ALD process for the "900C RTO" process sequence. The greater thickness for the hafnium oxide formed by the "900C RTO_RT SC1" process sequence relative to the hafnium oxide formed by the "900C RTO" process sequence reflects reduction of defect density at the interface between the bottommost surface of the deposited hafnium oxide material and the underlying silicon oxide material. Thus, the "900C RTO_RT SC1" process sequence provides a nucleation defect density comparable to the nucleation defect density achievable by the "chemox" process sequence, which is less than the nucleation defect density provided by the "900C RTO" process sequence.

Figure 6:
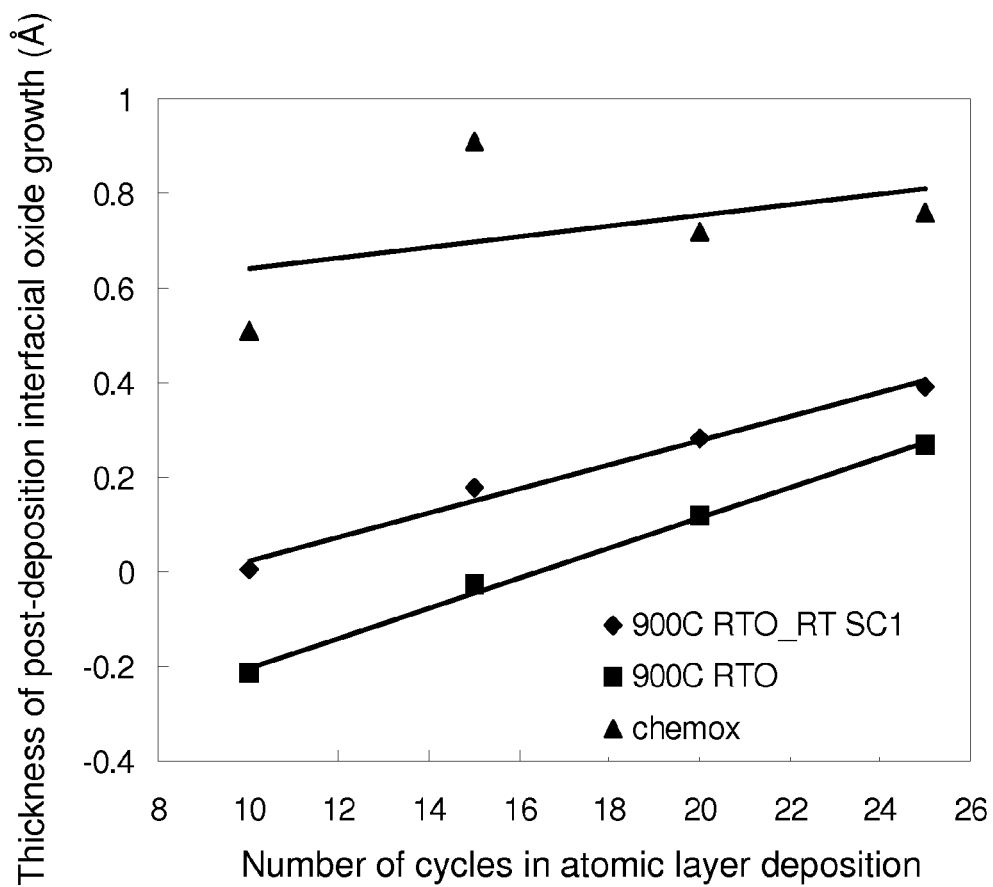
FIG. 6 is a graph illustrating the dependence of the thickness of post-deposition interfacial dielectric material growth on the number of cycles in an atomic layer deposition for different process sequences processes according to an embodiment of the present disclosure.

The thickness of a semiconductor-containing dielectric material layer after the ALD process, i.e., in a "post-deposition" state, is greater relative to the thickness of the semiconductor-containing dielectric material layer before the ALD process because of a collateral increase in the thickness of the semiconductor-containing dielectric material layer during the ALD process. As used herein, "post-deposition interfacial dielectric material growth" refers to the increase in thickness of a semiconductor-containing dielectric material layer during deposition of a metal oxide layer thereupon by an ALD process. Referring to FIG. 6, the dependence of the thickness of post-deposition interfacial dielectric material growth on the number of cycles in an atomic layer processes is shown for different process sequences employed to generate the graph of FIG. 5.

FIG. 6 shows that the "900C RTO_RT SC1" process sequence provides lesser post-deposition interfacial dielectric material growth than the "chemox" process sequence. The additional post-deposition interfacial dielectric material growth introduced by the surface treatment in the "900C RTO_RT SC1" process sequence relative to the "900C RTO" process sequence is only about 0.2 nm. Thus, the "900C RTO_RT SC1" process sequence provides lesser post-deposition interfacial dielectric material growth than the "chemox" process sequence, and provides a lesser nucleation defect density than the "900C RTO" process sequence.

Figure 7:
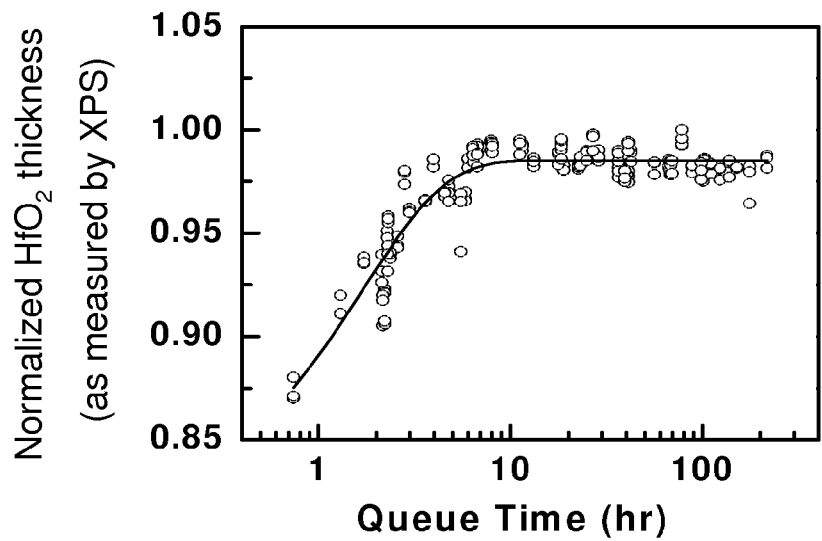
FIG. 7 is a graph of a normalized thickness of hafnium oxide as a function of a queue time in a "900C RTO" process sequence.

Referring to FIG. 7, a graph of a normalized thickness of hafnium oxide layer illustrates a variation of the thickness of a hafnium oxide layer as a function of a queue time for the "900C RTO" process sequence. The queue time for the "900C RTO" process sequence herein refers to the time lag between the end of a rapid thermal oxidation employed to form a silicon oxide layer and the beginning of the ALD process according to the "900C RTO" process sequence. The same number (e.g., 24) of deposition cycles for all of the hafnium oxide layers, while the only variable of the test was the queue time. Significant variations in the thickness of the hafnium oxide layer were observed as a function of the queue time. Without wishing to be bound by a theory, this variation may be a result of a gradual change in the surface condition of the thermal silicon oxide as a function of time.

Figure 8:
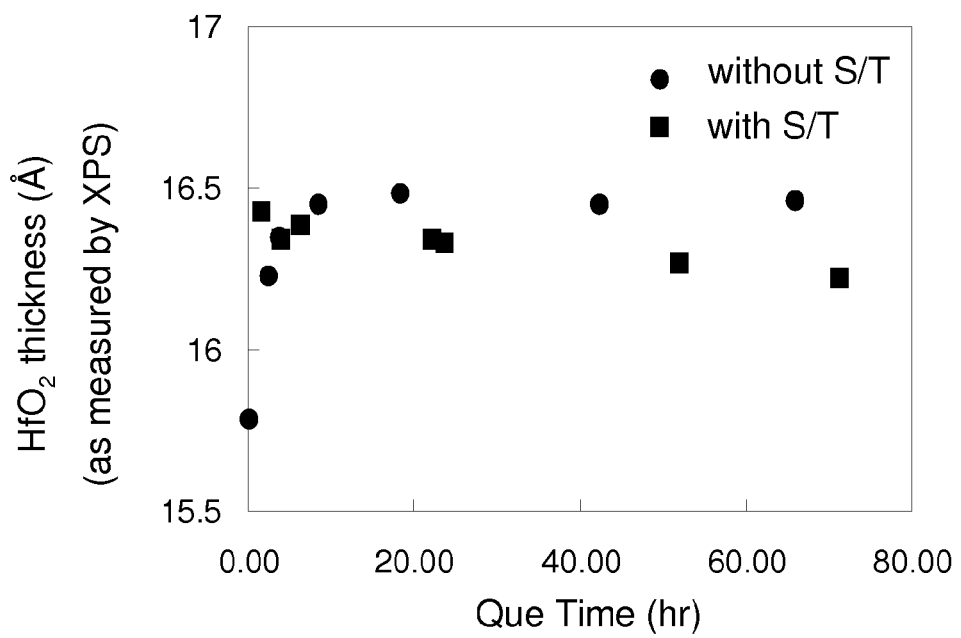
FIG. 8 is a graph illustrating the thicknesses of hafnium oxide layers formed employing various queue times and with or without a preclean process according to an embodiment of the present disclosure.

FIG. 8 is a graph illustrating the thicknesses of hafnium oxide layers formed employing various queue times and with or without a surface treatment (S/T) process. The surface treatment process functions as a preclean process that prepares the surface of a silicon oxide layer prior to an ALD process. The process sequence labeled "with S/T" corresponds to the "900C RTO_RT SC1" process sequence, and the process sequence labeled "without S/T" corresponds to the "900C RTO" process sequence. The queue time for the "900C RTO_RT SC1" process sequence herein refers to the time lag between the end of a surface treatment employing the SC1 solution and the beginning of the ALD process according to the "900C RTO" process sequence. The thickness of the hafnium oxide layer depends only gradually on the queue time for the "900C RTO_RT SC1" process sequence, while the thickness of the hafnium oxide layer varies significantly if the queue time is less than 10 hours.

Figure 9:
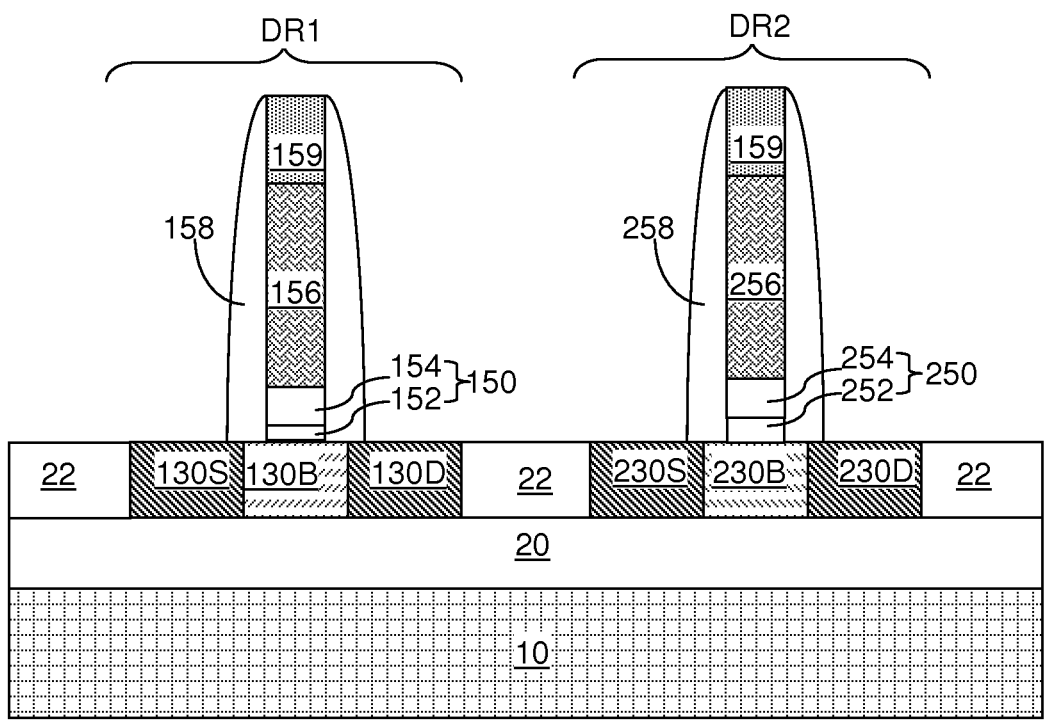
FIG. 9 is a vertical cross-sectional view of the exemplary semiconductor structure after formation of field effect transistors according to an embodiment of the present disclosure.

Referring to FIG. 9, field effect transistors can be formed in each of the first and second device regions (DR1, DR2) employing the metal oxide layer 54L. Specifically, a gate conductor layer and a gate cap dielectric layer can be deposited on the top surface of the metal oxide layer 54L of the exemplary semiconductor structure. The gate cap dielectric layer, the gate conductor layer, the metal oxide layer 54L, and the first semiconductor-containing dielectric material layer 152L and the second semiconductor-containing dielectric material layer 252L are patterned by a combination of lithographic methods and at least one anisotropic etch to form gate stack structures.

A first gate stack structure formed in the first device region DR1 includes a first gate dielectric 150, a first gate electrode 156, and a first gate cap dielectric 159. A second gate stack structure formed in the second device region DR2 includes a second gate dielectric 150, a second gate electrode 256, and a second gate cap dielectric 259. The first gate dielectric 156 includes a vertical stack of a first semiconductor-containing dielectric material portion 152 and a first metal oxide portion 154. The first semiconductor-containing dielectric material portion 152 is a remaining portion of the first semiconductor-containing dielectric material layer 152L, and the first metal oxide portion 154 is a remaining portion of the metal oxide layer 54L. The second gate dielectric 256 includes a vertical stack of a second semiconductor-containing dielectric material portion 252 and a second metal oxide portion 254. The second semiconductor-containing dielectric material portion 252 is a remaining portion of the second semiconductor-containing dielectric material layer 252L, and the second metal oxide portion 254 is a remaining portion of the metal oxide layer 54L.

A first dielectric gate spacer 158 can be formed around the first gate stack (152, 154, 156, 159), and a second dielectric gate spacer 258 can be formed around the second gate stack (252, 254, 256, 259). Electrical dopants (e.g., p-type dopants or n-type dopants) can be implanted into the first semiconductor material portion 130 and the second semiconductor material portion 230 to form a first source region 130S, a first drain region 130D, a second source region 230S, and a second drain region 230D. An unimplanted portion of the first semiconductor material portion 130 (See FIG. 4) is a first body region 130B, and an unimplanted portion of the second semiconductor material portion 230 (See FIG. 4) is a second body region 230B. In one embodiment, one of the two transistors can be a p-type field effect transistor, and another of the two transistors can be an n-type field effect transistor.

Figure 10:
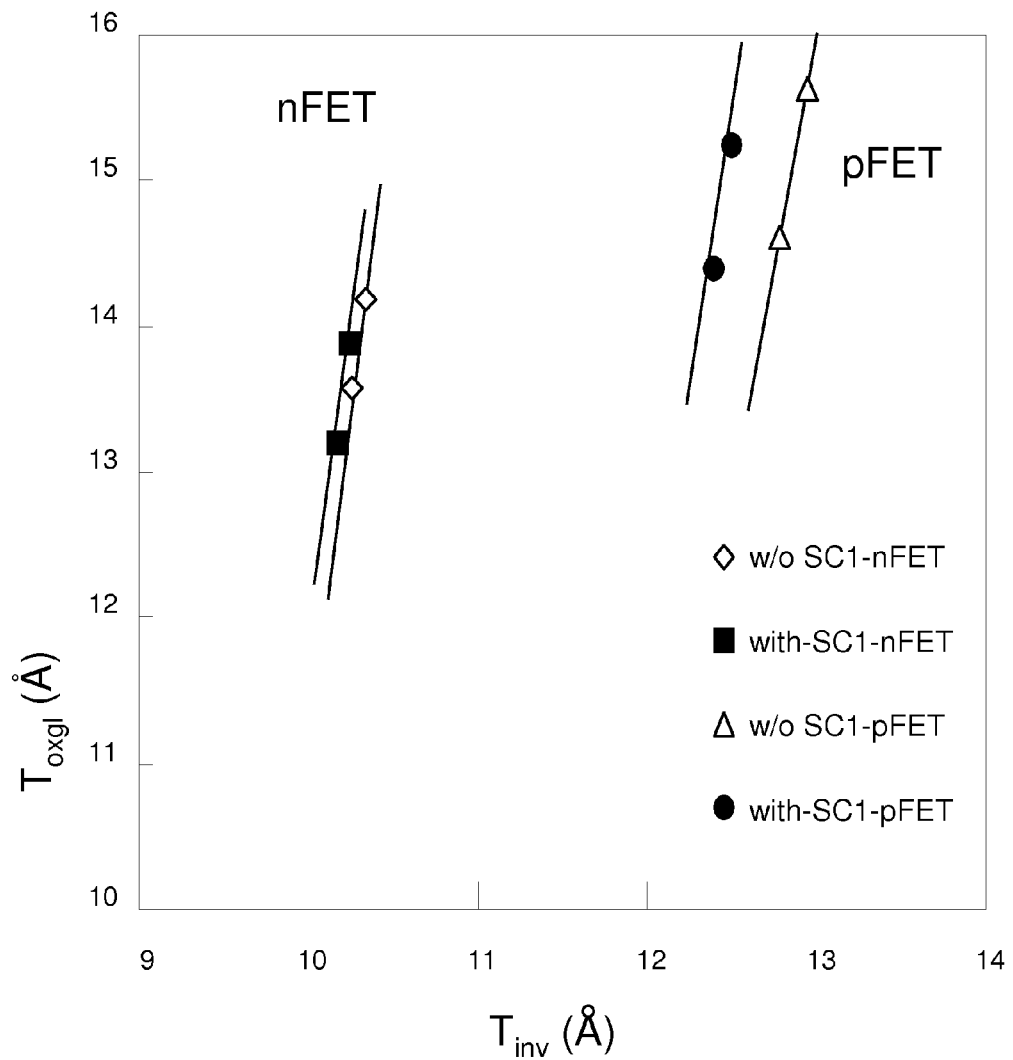
FIG. 10 is a graph illustrating the thicknesses of hafnium oxide layers formed on different semiconductor surfaces with or without a preclean process according to an embodiment of the present disclosure.

Referring to FIG. 10, a graph illustrating the thicknesses of hafnium oxide layers formed on different semiconductor surfaces with or without the surface treatment, i.e., without or without the preclean process. A pair of a p-type field effect transistor (pFET) and an n-type field effect transistor (nFET) was manufactured employing the "900C RTO_RT SC1" process sequence described above. Another pair of a pFET and an nFET was manufactured employing the "900C RTO" process sequence described above. Each pFET was formed on a single crystalline silicon-germanium alloy surface having an atomic concentration of germanium at 10 to 70%, or pure germanium and each nFET was formed on a single crystalline silicon surface.

The inversion thickness ($T_{inv}$) of the resulting gate dielectric (which is equivalent to the first gate dielectric 150 or the second gate electric 250 in FIG. 9) was measured through measurement of the thickness of the inversion layer in the channel of the corresponding field effect transistor. The equivalent oxide thickness ($T_{oxgl}$) of the resulting gate dielectric was measured through measurement of the leakage current through the gate dielectric of the corresponding field effect transistor.

The data labeled "w/o SC-nFET" corresponds to the gate dielectric of the nFET formed employing the "900C RTO" process sequence. The data labeled "with SC-nFET" corresponds to the gate dielectric of the nFET formed employing the "900C RTO_RT SC1" process sequence. The data labeled "w/o SC-pFET" corresponds to the gate dielectric of the pFET formed employing the "900C RTO" process sequence. The data labeled "with SC-pFET" corresponds to the gate dielectric of the pFET formed employing the "900C RTO_RT SC1" process sequence. The differential between the inversion thickness of the pFET and the nFET is less for the transistors formed employing the "900C RTO_RT SC1" process sequence than for the transistors formed employing the "900C RTO" process sequence. Thus, the methods of embodiments of the present disclosure can be employed to provide complementary metal oxide semiconductor (CMOS) devices having better matched inversion thicknesses of gate dielectrics across the pFET's and the nFET's than methods employing the "900C RTO" process sequence.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor device comprising:
   providing a first device region having a first semiconductor material portion of a first semiconductor material;
   providing a second device region having a second semiconductor material portion of a second semiconductor material that is different from said first semiconductor material;
   forming a first semiconductor-containing dielectric material layer on said first semiconductor material portion and a second semiconductor-containing dielectric material layer on said second semiconductor material portion, wherein said first semiconductor-containing dielectric layer has a first hydroxyl group terminated top surface, and said second semiconductor-containing dielectric layer has a second hydroxyl group terminated top surface; and forming a metal oxide layer on said first semiconductor-containing dielectric material layer and said second semiconductor-containing dielectric material layer, wherein a portion of said metal oxide layer and a portion of each of said first semiconductor-containing dielectric material layer and said second semiconductor-containing dielectric material layer form a gate oxide material in each of said first and second device regions, wherein a difference in thickness of said gate oxide materials over said first device region and said second device region is less than 3 angstroms.

2. The method of claim 1, wherein said first semiconductor material portion comprises silicon, and said second semiconductor material portion comprises a silicon-germanium alloy.

3. The method of claim 1, wherein said first semiconductor-containing dielectric layer comprises a dielectric oxide or a dielectric oxynitride of said first semiconductor material, and said second semiconductor-containing dielectric layer comprises a dielectric oxide or a dielectric oxynitride of said second semiconductor material.

4. The method of claim 1, wherein said forming said first semiconductor-containing dielectric layer and said second semiconductor-containing dielectric layer comprises conversion of a surface portion of each of said first semiconductor material portion and said second semiconductor material utilizing a thermal oxidation process, a plasma oxidation process, a thermal nitridation process, a plasma nitridation process, a thermal oxynitridation process, a plasma oxynitridation process, or a combination thereof.

5. The method of claim 1, wherein each of said first hydroxyl group terminated top surface and said second hydroxyl group terminated top surface has at least 90% hydroxyl group termination.

6. The method of claim 1, wherein said first semiconductor-containing dielectric layer having said first hydroxyl group terminated top surface and said second semiconductor-containing dielectric layer having said second hydroxyl group terminated top surface are formed by:

forming a first pristine semiconductor-containing dielectric material layer on said first semiconductor material portion and a second pristine semiconductor-containing dielectric material layer on said second semiconductor material portion; and treating top surfaces of said first pristine semiconductor-containing dielectric layer and said second pristine semiconductor-containing dielectric layer by an etchant.

7. The method of claim 6, wherein said etchant comprises a basic solution or a basic vapor.

8. The method of claim 7, wherein said etchant comprises ammonium hydroxide and hydrogen peroxide.

9. The method of claim 8, wherein said etchant further comprises deionized water.

10. The method of claim 9, wherein a volume ratio among ammonium hydroxide, hydrogen peroxide, and deionized water is 1:x:y, wherein x is in a range from 0.5 to 2, and y is in a range from 3 to 20.

11. The method of claim 6, wherein said etchant removes top portions of said first pristine semiconductor-containing dielectric layer and said second pristine semiconductor-containing dielectric layer.

12. The method of claim 1, wherein said metal oxide layer comprises an oxide of a transition metal or an oxide of a Lanthanide element.

13. The method of claim 12, wherein said metal oxide layer comprises $HfO_2$, $ZrO_2$, $La_2O_3$, $Al_2O_3$, $TiO_2$, or $Y_2O_3$.

14. The method of claim 1, wherein said metal oxide layer is formed by atomic layer deposition.

15. The method of claim 1, further comprising forming a shallow trench isolation structure laterally surrounding said first semiconductor material portion and said second semiconductor material portion, wherein the metal oxide layer is formed on said first semiconductor-containing dielectric material layer, said second semiconductor-containing dielectric material layer and said shallow trench isolation structure.

* * * * *